(12) United States Patent
Knight et al.

(10) Patent No.: US 7,665,322 B2
(45) Date of Patent: Feb. 23, 2010

(54) METHOD OF REDUCING FLUID EMISSIONS FROM A GLOBAL SPRAY COOLING SYSTEM

(75) Inventors: Paul A. Knight, Spokane, WA (US); Charles L. Tilton, Colton, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 596 days.

(21) Appl. No.: 11/641,509

(22) Filed: Dec. 18, 2006

(65) Prior Publication Data

US 2007/0199204 A1    Aug. 30, 2007

Related U.S. Application Data

(63) Continuation-in-part of application No. 10/648,774, filed on Aug. 25, 2003, now Pat. No. 7,150,109.

(51) Int. Cl.
*F25D 23/12* (2006.01)
*F28D 15/00* (2006.01)
*H05K 7/20* (2006.01)

(52) U.S. Cl. ............... 62/259.2; 165/104.33; 361/690; 361/699

(58) Field of Classification Search ............ 62/259.2, 62/376; 165/104.33; 361/699, 690, 689, 361/700; 239/443
See application file for complete search history.

(56) References Cited

U.S. PATENT DOCUMENTS 7,380,409 B2 *   6/2008   Campbell et al. .......... 62/259.2

* cited by examiner

*Primary Examiner*—Chen-Wen Jiang
(74) *Attorney, Agent, or Firm*—Michael S. Neustel

(57) ABSTRACT

The present invention uses multiple global cooling chambers for providing liquid cooling to a plurality of electronic components. The global cooling chambers utilize a non-electrically conductive fluid which is in direct contact with the components to be cooled. The system provides very effective heat transfer rates, environmental isolation of the electronics components and can be deployed in a wide range of applications. Multiple global cooling chambers allows for the hot swapping of cards during operation of the system. Valves provide the ability to minimize the amount of interaction between the cooling fluid and air outside the chambers.

6 Claims, 11 Drawing Sheets

METHOD OF REDUCING FLUID EMISSIONS FROM A GLOBAL SPRAY COOLING SYSTEM

CROSS REFERENCE TO RELATED APPLICATION

The present invention is a continuation-in-part of U.S. patent application Ser. No. 10/648,774 filed Aug. 18, 2003 entitled "Wet-Dry Thermal Management System". The Ser. No. 10/648,744 patent application is incorporated herein by this reference.

STATEMENT REGARDING FEDERALLY SPONSORED R&D

Not applicable to this application.

TECHNICAL FIELD

This invention relates to a liquid cooling system, and more particularly to a direct liquid cooling system that utilizes a chassis that contains a plurality of individually sealed chambers.

BACKGROUND OF THE INVENTION

Liquid cooling is becoming widely understood in the field of electronics cooling. Rather than use air to cool heat producing components, liquid is used to absorb and transport the heat. Liquids are typically much more efficient than air as a heat transfer fluid since they have considerably higher thermal conductivities, specific heat capacities and provide the opportunity for phase change processes.

Liquid cooling systems used to cool commercial type electronics generally utilize a closed loop process. Although some liquid cooling systems, such as heat pipes, are passive, active systems provide system flexibility needed for most cooling applications. With active systems, the fluid is pressurized via one or more pumps. The pressurized fluid is delivered to the cooling module wherein the fluid absorbs heat from an electronic component. The fluid leaving the cooling module is transported to a heat exchanger wherein the heat is removed from the fluid. Many other components, such as filters, may be placed into the closed loop system for additional system functionality.

There are many ways for the liquid of a cooling system to absorb heat from the heat producing device. Forced convection is often used by cold plates. Cold plates replace heat sinks and keep the fluid separate from the electronics to be cooled. Inside the cold plate can be features such as micro-channels and mini-channels, which increase the surface area and overall heat transfer. Cold plates are required for use with conductive liquid cooling fluids, such as water. Water must be kept separate from the electronics since it would obviously short out the circuits and cause irreparable harm to the electronic systems and components.

Dielectric fluids are electrically inert to electronic components. Depending upon the exact type of fluid, dielectric fluids typically have breakdown voltages in excess of air. Fluorinert (a trademark of 3M) is a commercially available dielectric fluid that has been used in liquid cooling systems for several decades. Most electronic components can be placed directly in contact with dielectric fluids, such as Fluorinert. By placing the fluid in direct contact with components to be cooled, heat transfer rates can be much greater than typical cold plate systems. In addition, entire boards having many electronic components of varying height and shapes can be cooled by a single liquid cooling system. In addition to Fluorinert, other dielectric fluids are available such as commonly used refrigerants.

A significant challenge in using dielectric fluids within closed loop cooling systems is that they typically have poor heat transfer properties. Fluorinert, for example, has a thermal conductivity value in the range of air. Water has a thermal conductivity several orders of magnitude greater. The result is that it can be difficult to get heat into dielectric fluids. To make dielectric fluids effective, two-phase cooling can be employed. Rather than use single phase heat transfer wherein a fluid is heated up by sensible heat gains, two-phase cooling takes advantage of changing liquid into vapor. Liquid absorbs heat and transforms into vapor which requires substantial amounts of energy. The vapor is condensed by a heat exchanger back to liquid form. The result is a highly efficient system. Preferably, thin-film evaporative cooling is used to maximize heat transfer coefficients.

Spray cooling is an ideal thin-film cooling method for producing effective and efficient dielectric liquid cooling systems. Fluid is pumped via a pump and delivered to a spray module. Nozzles, preferably atomizers, break up the liquid into small drops that travel to the cooling surface with significant momentum. The drops create a very thin coolant film which readily changes phase to a vapor state. The drops also entrain vapor within the module. Entrained vapor can be used to further reduce the thickness of the cooling film and reduce localized pressures, both results increase heat transfer coefficients. Spray cooling can be used within cold plates for systems that have localized heat sources, and can also be used within global type systems that spray the fluid directly on entire electronic systems. A coldplate spray cooling system is described by U.S. Pat. No. 7,104,078 and U.S. Pat. No. 5,220,804; and a global spray cooling system is described by U.S. Pat. No. 5,880,931 and U.S. Pat. No. 6,976,528.

Global spray cooling allows electronics to be used in revolutionary ways. By creating a completely sealed chamber for the electronics, the systems can be used in environments that may be nearly void of air, under water, and in extreme hot and cold. Global cooling is also ideal for benign environments, such as data centers. Global cooling can be used for blade servers which provides the ability to create very power dense systems and racks.

One problem with prior art global cooling systems is that because the electronics reside within a single chamber, the entire computing system must be shut down in order to provide service and maintenance of a single board within. Although the maintenance and service requirements may be perfectly acceptable for global cooling systems used in airplanes and standalone systems, the requirements are not optimal for use with systems that must be used in 7×24 applications. Computers used in data centers for example, are expected to be plug and play.

One method of creating hot-swappable electronics within a global cooling system is the "clamshell" method, such as described by U.S. Pat. No. 6,955,062. Cards are completely enclosed by a chamber. Each chamber has an inlet and an outlet comprised of quick disconnect couplings or blind mate connectors. The quick disconnect couplings are part of an electrical backplane. Each chamber can be removed from the backplane assembly individually. A weakness in the clamshell design is that the backplane assembly is not environmentally isolated. The result is that the system can not be placed in very harsh working environments. In addition, the cards typically have to be custom designed in order to interface with the clamshell housing.

Another problem with prior art global cooling systems that utilize single and large chambers for cooling, is that a significant amount of the fluid within is open to the environment during service and maintenance. Perfluorocarbon type fluids are very stable molecules, and hence, there is very little risk in the fluid breaking down. Perfluorocarbon type fluids do have the ability to absorb significant amounts of air. During maintenance cycles, it is disadvantageous to have the cooling fluid absorb air, or non-condensable gases, as during operation the non-condensable gases cause increased system pressures, saturation temperatures and temperatures of electronics. Other fluids, such as the Novec family (a trademark of 3M), may break down into other substances with the introduction of water, or water vapor. Prior art single chamber global cooling systems do provide the means to reduce the exposure of the fluid within the system to fluid and gases as part of the environment.

In these respects, the multi-chamber cooling system according to the present invention substantially departs from conventional concepts of the prior art, and in doing so provides an apparatus primarily designed to provide global cooling to electronics while allowing cards to be hot-swapped.

SUMMARY OF THE INVENTION

The present invention uses multiple global cooling chambers for providing liquid cooling to a plurality of electronic components. The global cooling chambers utilize a non-electrically conductive fluid which is in direct contact with the components to be cooled. The system provides very effective heat transfer rates, environmental isolation of the electronics components and can be deployed in a wide range of applications. Multiple global cooling chambers allows for the hot swapping of cards during operation of the system. Multiple global cooling chambers reduce the amount of interaction between the cooling fluid and the outside environment during service and maintenance. Another object of the present invention is to allow standard air cooled cards to be cooled within a global cooling system. Yet another object of the present invention is to allow fluid within individual chambers to drain back to the reservoir when not in use, or prior to opening the chamber for service or maintenance.

These and other features, aspects, and advantages of the present invention will become better understood with regard to the following description, appended claims, and accompanying drawings.

BRIEF DESCRIPTION OF THE DRAWINGS

Preferred embodiments of the invention are described below with the reference to the following accompanying drawings.

DETAILED DESCRIPTION OF THE PREFERRED EMBODIMENTS

Many of the fastening and fluid components utilized and described in this invention are widely known and used in the field of the invention, and their exact nature or type is not necessary for a person of ordinary skill in the art or science to understand the invention; therefore they will not be discussed in detail.

As used herein, the term "card" generally refers to an electronic system that may produce heat. A card may include a blade server, a networking device, or any type of computer sub-system. In addition, the card may be a power device, such as a power supply, or a conversion device such as used for converting alternating current to direct current, or vice-versa. The present invention should not be construed to be limited to any one type of card system.

As part of the description of the preferred embodiment, the present invention is described for use with the dielectric fluid Fluorinert (a trademark of 3M). Fluorinert is brand that represents a family of perfluorocarbon fluids. Each perfluorocarbon fluid has unique phase change properties. Fluorinert 5060 is ideal for many cooling applications as it changes phase from a liquid to a vapor in the range of 50 degrees Celsius at standard pressures. Other grades may suit a particular application better than others. Although the preferred embodiment of the present invention is described for use with Fluorinert, the present invention should not be construed to be limited to any particular grade of Fluorinert.

In addition, the present invention should not be construed to be limited to the family of perfluorocarbon fluids. Novec (a trademark of 3M) is another trade name for a family of dielectric fluids which can be used within the present invention. HFE7100 (a trademark of 3M), also known as methoxynonafluorobutane, has been successfully used within global cooling systems. Depending upon the type of dielectric fluid chosen for use within the present invention, it is likely to be compatible with different materials, such as o-rings, adhesives, and electrical connectors. The preferred embodiment described herein is consistently described for use with perfluorocarbon fluids. The present invention should not be construed to be limited to perfluorocarbon fluids however, as many other dielectric fluids can be used within the scope and spirit of the invention.

Although it is preferred to use dielectric fluids within the present invention, the present invention should not be construed to be limited to only dielectric fluids. Through the use of coatings and sealants, non-dielectric fluids can be applied to cards without causing shorting of the electronic components. Although an object of the present invention is to allow standard air cooled cards to be used within global cooling chambers without the need for secondary processes, the present invention should not be construed to be limited to dielectric fluids.

Figure 1:
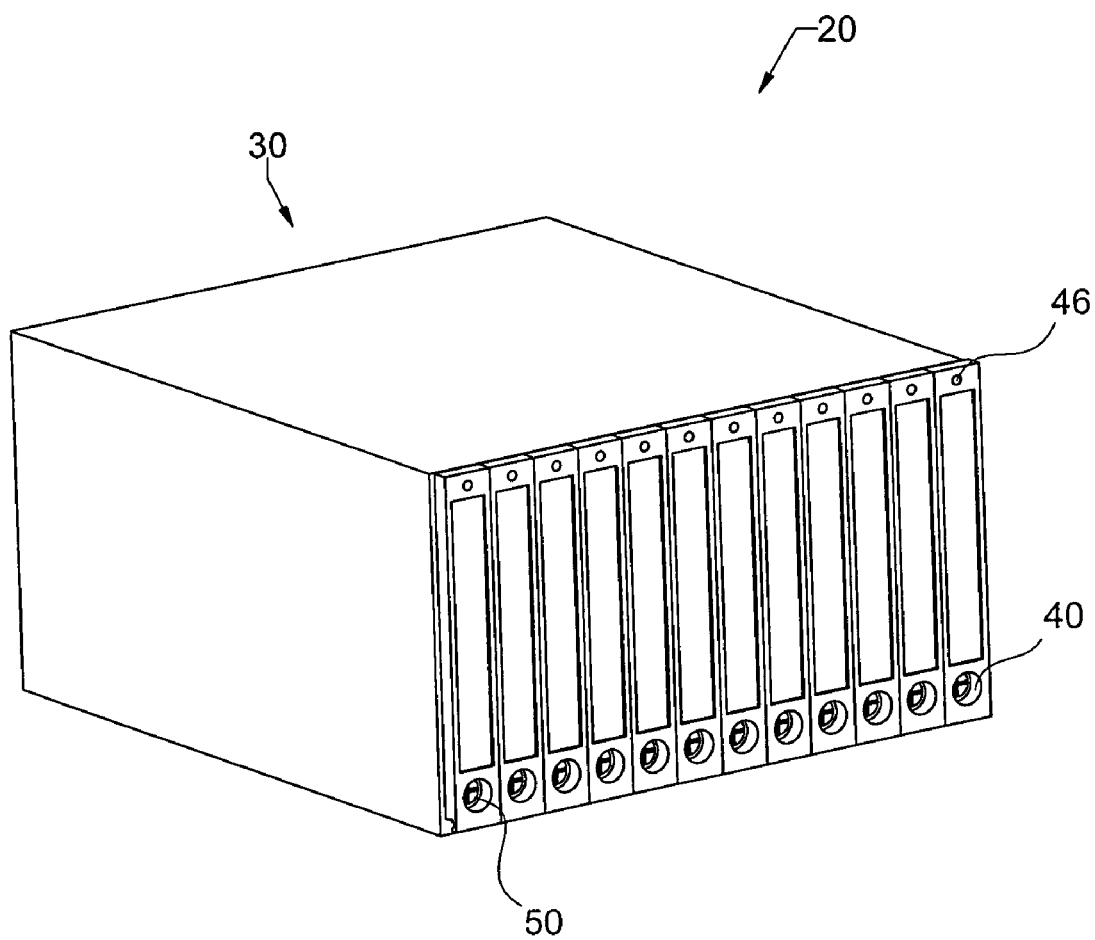
FIG. 1 is a perspective view of a multi-chamber global cooling system according to the present invention.

Now referring to FIG. 1, a multi-chamber global cooling system 20 is shown. Generally, cooling system 20 may provide two-phase liquid cooling to a heat producing card assembly 60. One or more of card assembly 60 may reside within a sealed cooling chamber 33 of a chassis 30. A cover 40 provides access to cooling chamber 33 so each card can be accessed individually. A valve 50 controls the flow of cooling fluid to and from chamber 33 so excessive loss of fluid does not occur when each card 60 is accessed.

Figure 14:
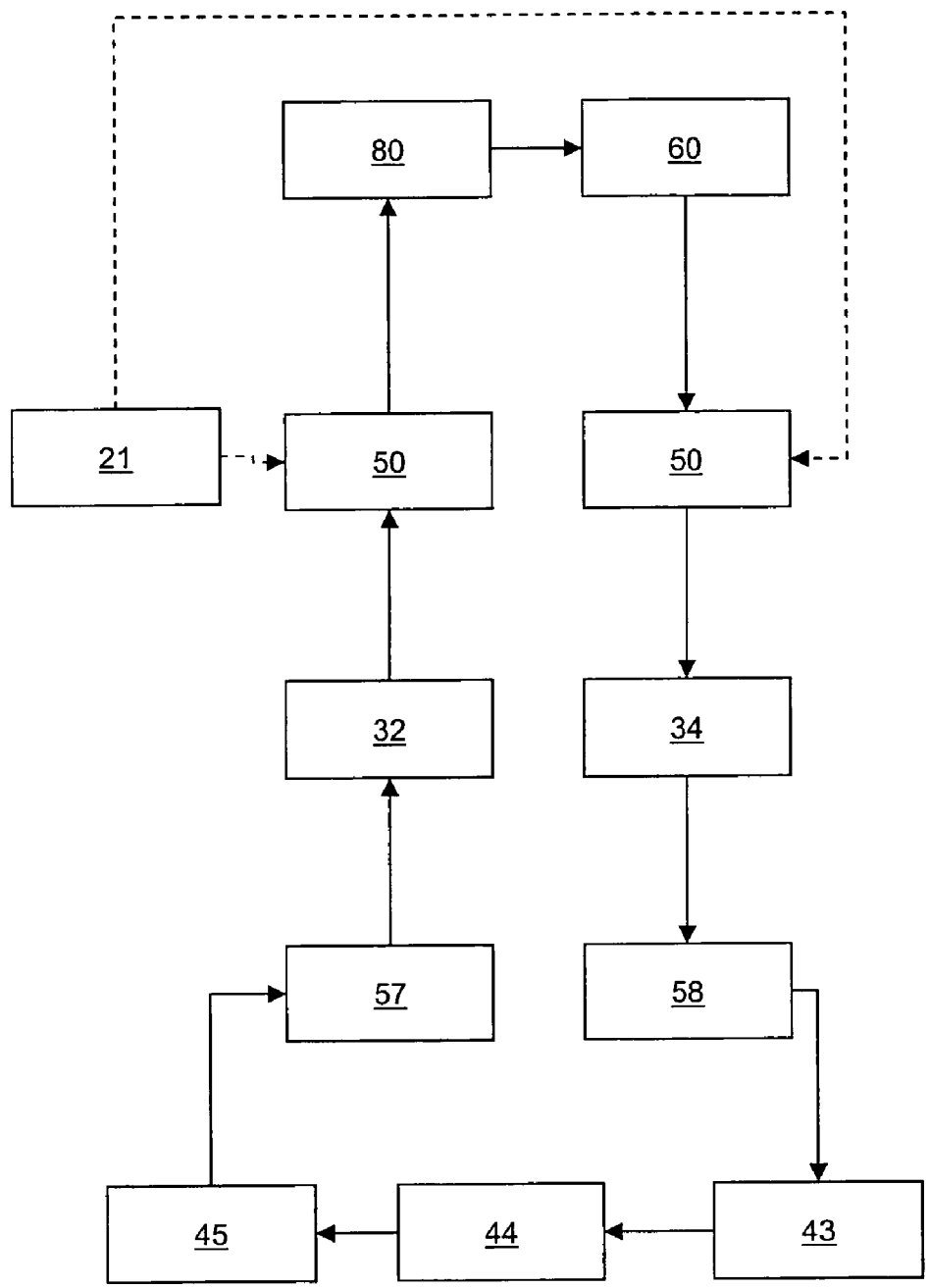

FIG. 14 shows the flow between some of the elements of the present invention and how they fit into an overall closed loop cooling system. A reservoir 44 is used for retaining a supply of liquid coolant. A pump 45 is fluidly connected to reservoir 44 and is used for converting the lower pressure coolant in reservoir 44 to a supply of higher pressure fluid. Depending upon the application of the closed loop cooling system, the reduced size of direct current motors can provide space advantages in comparison to alternating current pumps. Depending upon applications of the cooling system, U.S. Pat. No. 6,447,270 and U.S. Pat. No. 7,009,842 both provide advantageous pump configurations. Pump 45 supplies fluid to a supply fluid connector 57 located on the back of chassis 30. Supply fluid connector 57 is preferably a self sealing type that minimizes pressure losses of the fluid, as well as minimizes fluid loss when disconnected and connected. Acceptable fluid connectors are made available by the Colder Products Company and Faster Inc.

Optionally located between pump 45 and supply fluid connector 57 can be a fluid manifold system. An exemplary manifold system is described by U.S. Pat. No. 6,958,911 for a "Low Momentum Loss Fluid Manifold System" which is herein incorporated by reference in its entirety. A manifold system allows for multiples of cooling system 20 to be placed into a single application, such as a network rack used in a data center. Each system 20 can be removed and placed into the overall cooling system without disrupting the uptime of the others. In addition, fluid pressure drops are minimized.

Supply fluid connector 57 delivers the higher pressure supply fluid to a supply chamber 32 located within chassis 30. Supply chamber 32 allows for equalization of pressures and flow to a valve system 50. Valve system 50 provides the ability to stop and start the flow of supply fluid to a spray module 80 located in each of cooling chamber 33. Spray module 80 is used to provide improved fluid conditions to create two-phase liquid cooling of card 60. The two-phase liquid cooling process transforms the supply liquid coolant into a lower pressure return fluid having both vapor and liquid. This return fluid is transported again, through valve system 50 so cooling chamber 33 can be completely isolated from the rest of the cooling system. Return fluid from valve system 50 travels through a return chamber 33 to a return fluid connector 58. Return fluid connector 58 can be similar to supply fluid connector 57, although due to system impacts it is preferable to make return fluid connector 58 as large as possible. Pressure drops on the return side of the fluid system cause increased pressures within cooling chamber 33, resulting in increased boiling temperatures of the cooling fluid. Increased boiling temperatures of the fluid cause a corresponding increase in component temperatures of card 60.

Return fluid leaving return fluid connector 58 is delivered to a heat exchanger 43, and can also utilize a low momentum loss fluid manifold system between. Heat exchanger 43 condenses the vapor back to a liquid state and can provide subcooling of the liquid. Condensed liquid is returned to reservoir 44 to be re-pumped by pump 45. Acceptable heat exchanger technologies include fin and tube as well as bar and plate.

Figure 2:
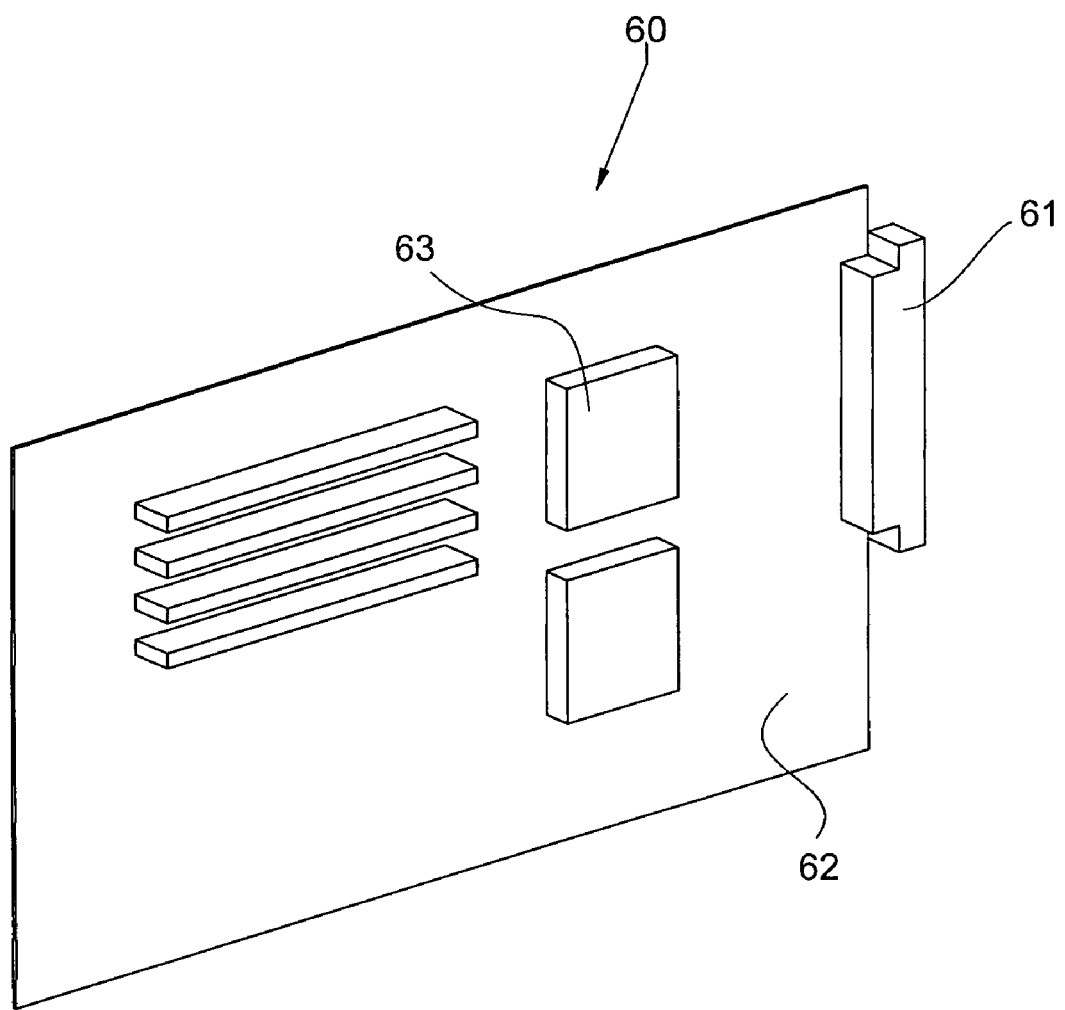
FIG. 2 is a perspective view of a typical heat producing electronic card that would be cooled by the multi-chamber global cooling system of FIG. 1.
Figure 3:
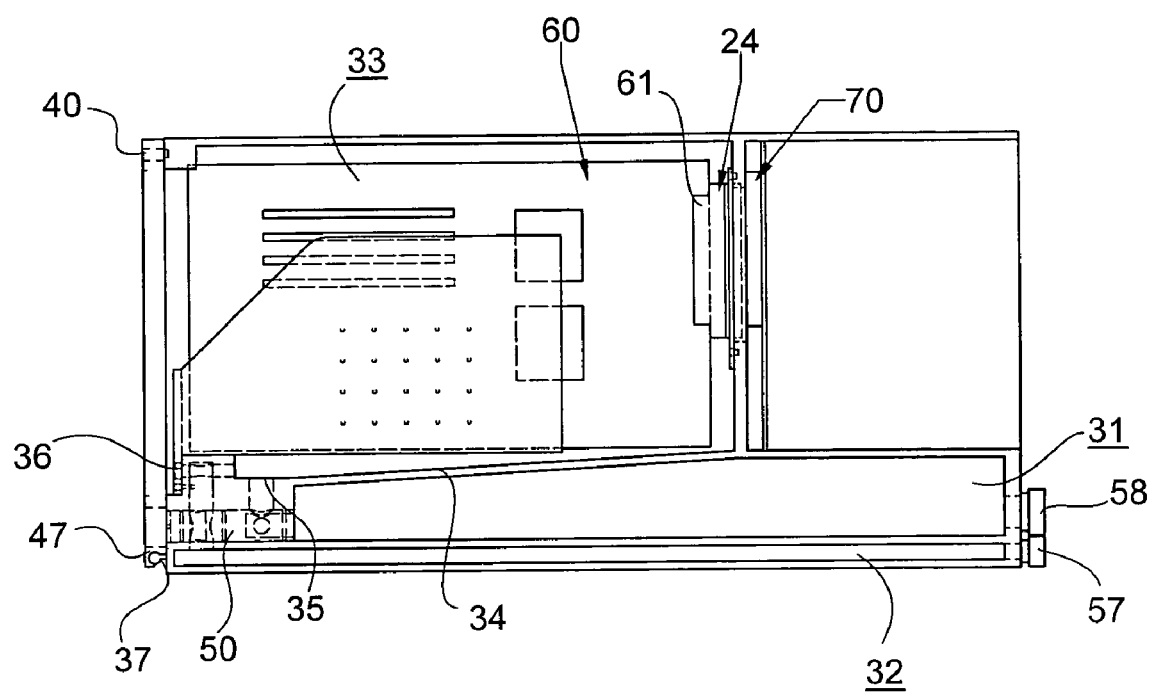
FIG. 3 is a side view of the multi-chamber global cooling system of FIG. 1, with the end panel of the chamber removed, making visible a cooling chamber.
Figure 4:
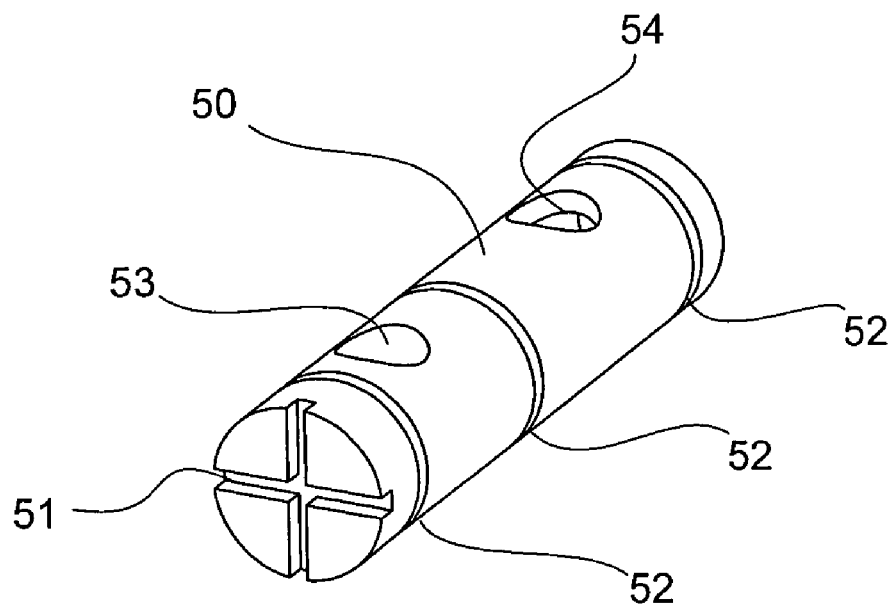
FIG. 4 is a front perspective view of a fluid control valve.
Figure 5:
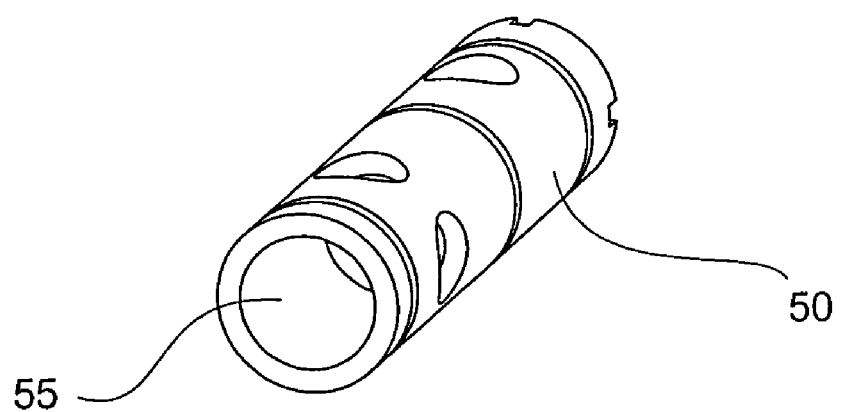
FIG. 5 is a rear perspective view of the fluid control valve of FIG. 4.
Figure 6:
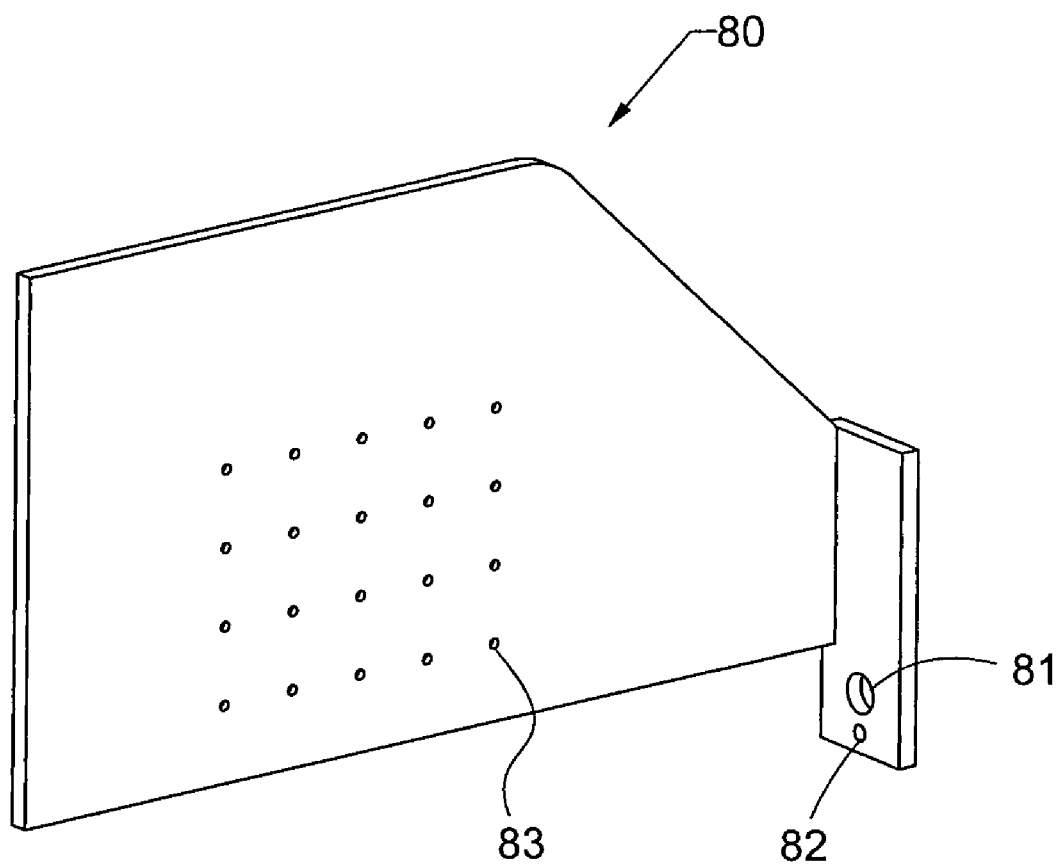
FIG. 6 is a perspective view of a spray module for dispensing cooling fluid onto the electronic card of FIG. 2.
Figure 7:
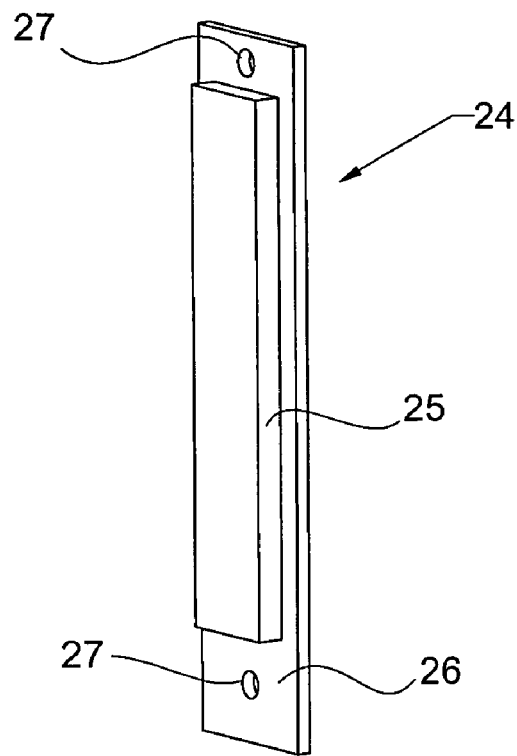
FIG. 7 is a front perspective view of a backplane sealing connector assembly.
Figure 8:
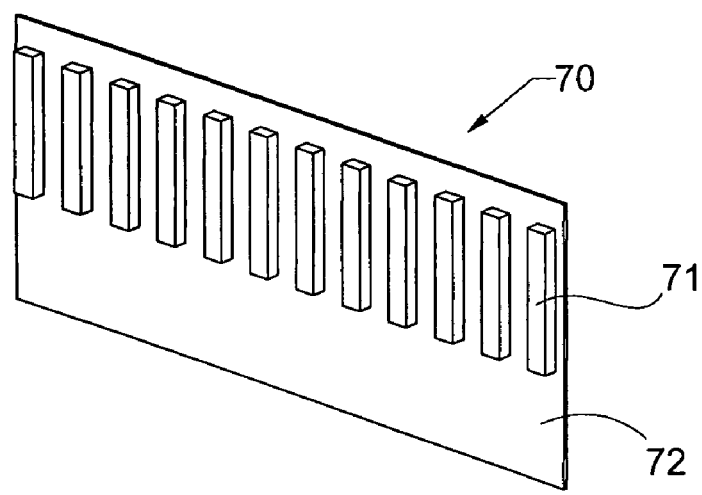
FIG. 8 is a perspective view of the front of an electrical backplane.

More detailed, FIGS. 2 through 13 distinctly show the interconnections of the elements of the present invention. Chassis 30 is shown with typical dimensions to support an array of blade servers. Card assembly 60 is shown in FIG. 2 as a typical blade server. Card substrate 62 is shown with dimensions roughly 10 inches tall and 17 inches long. Exact dimensions vary between type of blade server and manufacturer and hence the present invention can be optimized for any particular card but is not limited to any single version. On the back edge of card substrate 62 is an electrical connector 61 which provides electrical connectivity to card assembly 60. Typically, a blade server will have at least one CPU 63. CPU 63 can produce substantial amounts of heat over a limited surface area. With air cooling, the CPUs typically have heat sinks.

Card assembly 60 is surrounded and sealed by cooling chamber 33. Chassis 30 has multiples of cooling chamber 33 which each can house one or more card assembly 60. Shown in FIG. 7, a sealing connector assembly 24 has a sealing plate 26 and provides support to a sealing connector 25. Although sealing plate 26 can be glued to chassis 30 by means of an adhesive, preferably plate 26 is removably sealed to chassis 30 by means of an o-ring and pressure created by screws (not shown) through a sealing plate fastener hole 27 located at the top and bottom of plate 26. Although the exact dimension and pressures depends upon the size of chamber 33 and connector plate 26, it is preferable to use an o-ring with 10% to 20% compression when used in a radial seal scenario, and a 20% to 30% compression in a face seal scenario. It is also preferable to use Viton as the o-ring material as it is chemically compatible with Fluorinert. Sealing connector 25 may be comprised of one or more individual connectors as is commonly done in card type computer systems. Connector 25 may be a commercial type connector, or a specialized hermetic connector, but in either case it must provide a seal to the fluid type used. The purpose of sealing connector assembly 24 is to both provide electrical connection between card assembly 60 and a backplane assembly 70 and to provide a seal to cooling chamber 33. As shown, connector assembly 24 allows card assembly 60 to be removed from operation without disrupting the service of other cards. In the event that a failure were to occur with connector assembly 24, it can be individually replaced by removing any fasteners and disconnecting it from backplane assembly 70.

Figure 9:
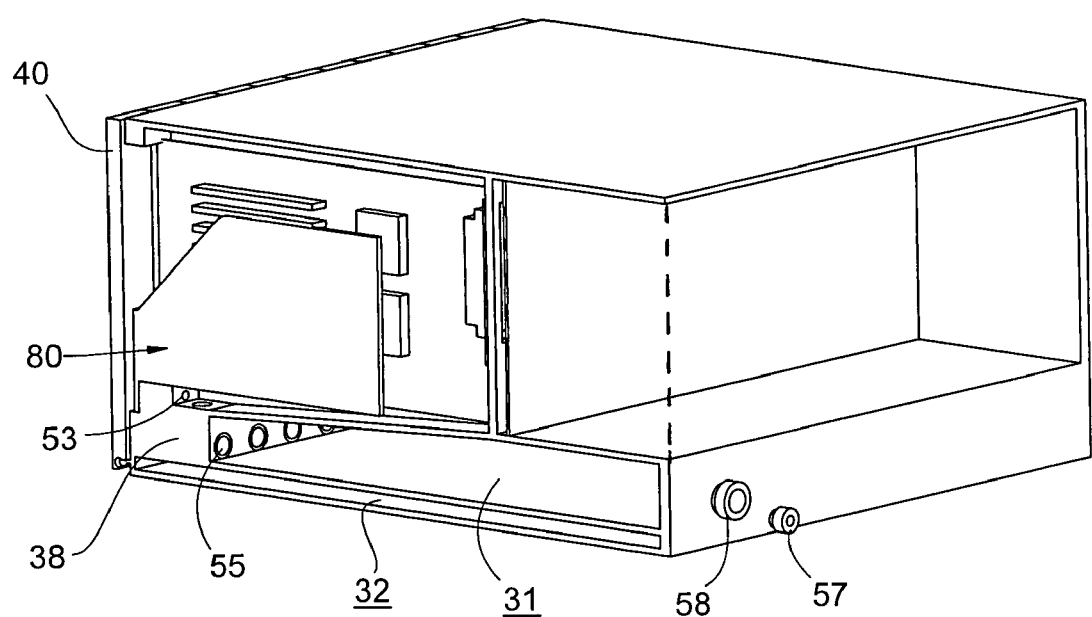
FIG. 9 is a perspective view of the multi-chamber global cooling system of FIG. 1 with the side of the chassis removed, the back and side wall of the chassis are shown to be transparent so that the backplane chamber of the system is sealed from the outside environment.
Figure 10:
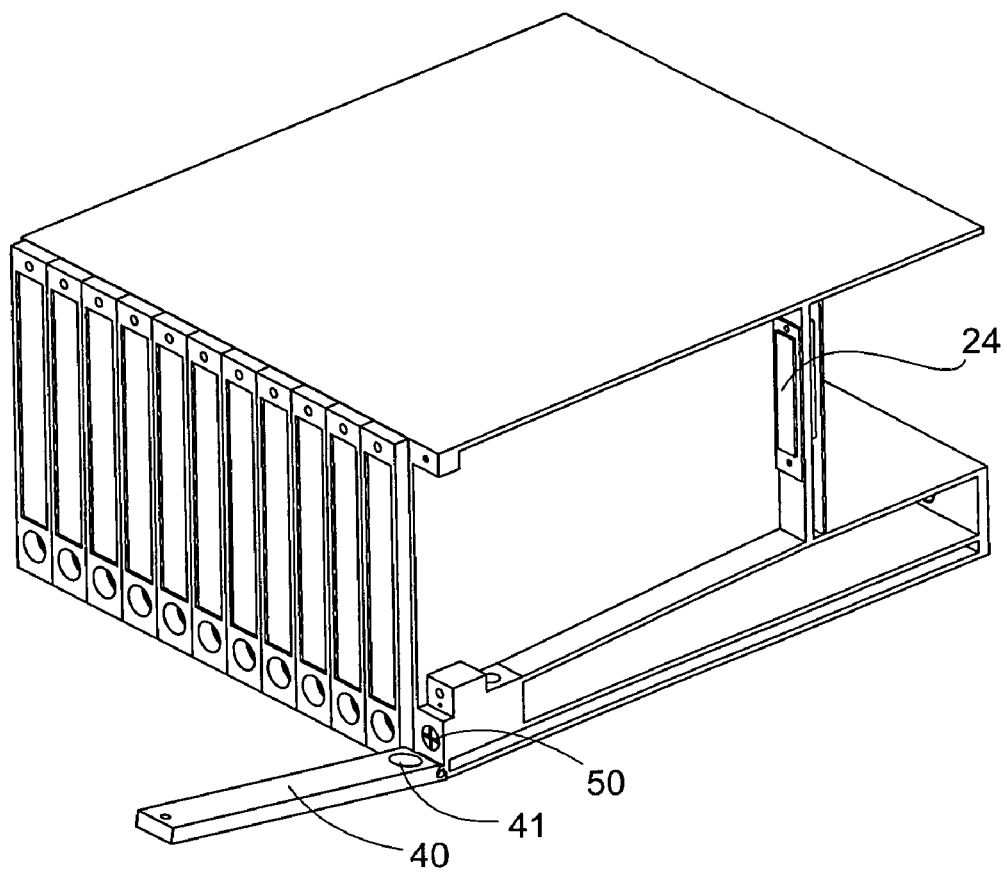
FIG. 10 is a perspective view of the multi-chamber global cooling system of FIG. 1, with the side of the chassis removed and a chamber cover in the open position.

Backplane assembly 70 would be typical of computer systems used today. A backplane substrate 72 holds an array of backplane connector 71. Backplane 72 may have active components and power conversion devices and provide input and output of power and signals via ports (not shown). For instance, a network connection can be made to the backplane and individual network connections can be distributed to each card 60 of multi-chamber global cooling system 20. Card 60 sealed within cooling chamber 33 may directly communicate with another card located in chassis 30. Backplane assembly 70 can be fastened to chassis 30 by means of commonly used standoffs and fasteners (not shown). As shown in FIG. 9 wherein the back and side walls of chassis 30 are shown transparent, chassis 30 can provide a completely sealed chamber for backplane assembly 70. The result is preferably an overall system, including backplane assembly 70, that can be completely sealed from the outside environment.

Card 60 is completely sealed within cooling chamber 33 by means of sealing connector assembly 24, the walls of chassis 30, cover 40 and valve 50. Cover 40 is preferably rotatably connected to chassis 30 through the use of a hinge joint. Cover 40 has a cover mounting groove 47 which engages with a chassis hinge pin 37. Cover 40 can rotate and be sealed to chassis 30 by means of an o-ring (not shown) which is compressed by a common fastener (not shown) though a cover fastener hole 46. The dimensions and compression forces for cover 40 should be similar to that of sealing connector assembly 24, already described herein. Cover 40 is preferably made from a clear plastic that is chemically compatible with the cooling fluid. Polycarbonate is suitable for use with perfluorocarbon fluids. The clear material makes it possible for the user to see the spray within cooling chamber 33 and any indicator lights on card assembly 60. In addition, and for use with fluids that may have negative effects when exposed to ultraviolet light, cover 40 may be made from a material that does not allow for the transmission of ultraviolet light to the cooling fluid. This may be accomplished by the base material of cover 40, or a film, or coating, may be applied to nearly any base material. Such a ultraviolet reflecting or absorbing cover may be advantageous when fluids from the Novec family (a trademark of 3M) are used.

Mounted within cooling chamber 33 is spray module 80. Spray module 80 receives supply fluid from a supply port 36 which is on the output side of a supply passage of valve 50. An o-ring (not shown) seals spray module 80 to supply port 36 and a common fastener (not shown) through module fastener hole 82 secures spray module 80 in place. Fluid travels between the two thin plates of spray module 80 wherein a nozzle 83 dispenses the fluid onto card assembly 60. Nozzle 83 may be a simple orifice creating a jet of fluid, or preferably a pressure swirl atomizer. Typical atomizer orifice sizes are six-thousandths to twelve-thousandths of an inch in diameter. At fifteen pounds per square inch of supply pressure, a flow rate of twenty milliliters per minute provides acceptable heat transfer rates. Too much flow causes incomplete vaporization of supply fluid and too little causes dry out and component failures.

For most applications more than one nozzle 83 is needed for complete cooling coverage of card assembly 60. Multiples of nozzle 83 may be placed in a rectangular array, or can be optimized by having a more dense population over higher heat producing components, such as CPU 63, and less dense populations over lower heat flux zones. It is also possible to have a fewer number of nozzles with wider spray angles over lower heat flux areas.

In addition to size and flow of individual nozzles, it is also possible to optimize the cooling mode within each cooling chamber 33. U.S. Pat. No. 7,009,842 for a "Three Dimensional Packaging and Cooling of Mixed Signal Mixed Power Density Electronic Modules" is incorporated in its entirety by this reference. U.S. Pat. No. 7,009,842 teaches optimizing cooling modes, such as but not limited to direct impingement, narrow gap or transverse spray, and vapor entrainment, depending upon the geometry and cooling characteristics of the card system being cooled. Each card may be shipped by its manufacturer with its own unique version of spray module 80. For added structural support, spray module 80 may be secured to card 60 by means of standoffs and common fasteners (not shown).

Fluid is delivered to spray module 80 by means of a chassis valve chamber 38 which houses valve assembly 50. Vapor and leftover liquid coming from card 60 within cooling chamber 33 enters chassis valve chamber 38 via return port 35. The bottom surface of cooling chamber 33 can be flat, but preferably it has an angled chassis bottom 34 which provides the means to allow gravity to assist the fluid momentum of the system in getting excess liquid within chamber 33 to return port 35. If fluid within chamber 33 builds up excessively it can deplete reservoir 44, increase the quantity of fluid within system 20, and potentially flood card 60. Components immersed in a pool of dielectric fluid can be susceptible to overheating as single phase cooling results. Chassis bottom 34 provides the means to minimize the amount of cooling fluid within cooling chamber 33.

Valve assembly 50 is axially constrained by chassis valve chamber 38, but allowed to rotate. An access groove 51 on the front end of valve 50 allows valve 50 to rotate through the use of a Phillips style screwdriver. Grooves 51 can be made for use with a custom tool as well. Valve 50 has a plurality of an o-ring channel 52 which provides seating and retention of an o-ring (not shown). The plurality of o-ring 52 isolates the supply fluid from the return fluid, and keeps both from leaking from chassis 30. With the position of valve 50 in the open position with respect to chassis valve chamber 38, fluid from supply chamber 32 flows through valve supply passage 53, through supply port 36 of chassis 30 and into spray module 80. By rotating valve 50 to the supply closed position, supply passage 53 is not aligned to supply port 36 and not open to supply chamber 32, hence no supply fluid flows to spray module 80.

Similarly, valve 50 has a return passage 54 that when supply passage is in the open position also allows for fluid to flow from cooling chamber 33 through return port 35, into return passage 54, out a return opening 55 into return chamber 31. The open position of valve 50 allows fluid to cool card 60 and for the return fluid to make it to heat exchanger 43. Conversely, when valve 50 is orientated in the closed position, supply fluid does not make it to cool card 60 and return fluid within cooling chamber 33 is isolated within.

A third position of valve 50 is the drain position. Valve 50 has a single supply passage 53 but two of return passage 54. The drain position has return passage 54 in line with return port 35, allowing return fluid to drain from cooling chamber 33 into return chamber 31, but does not provide for fluid to flow from supply chamber 32 to supply passage 53. The result is that cooling is not provided to card 60 and any excess fluid within cooling chamber 33 can flow under the effects of gravity to heat exchanger 43, or preferably to reservoir 44. The drain position is used when card 60 is off and does not require cooling. Such a time may be appropriate just prior to card 60 being accessed for maintenance or service. After valve 50 being in the drain orientation for some time, primarily vapor may be left inside of cooling chamber 33, reducing the amount of fluid that may be displaced while servicing any particular card. After some delay, valve 50 may be rotated from the drain position to the closed position so card 60 may be accessed without fluid flow. Valve 50 may be accessed through a cover opening 41, which allows it to be turned with cover 40 in the closed and sealed position.

To install card 60 into cooling system 20, cooling chamber 33 is accessed by means of opening cover 40. Valve 50 should be in the closed position so that no fluid can flow into or out of cooling chamber 33. Card 60 is placed inside of cooling chamber 33 with rear connector 61 of card 60 inserted into backplane connector 71. Spray module 80 is placed adjacent to card 60 with supply connection 81 in direct contact with supply port 36. Cover 40 is rotated to its upright position so it seals cooling chamber 33. Valve 50 should be turned to the open position prior to starting up card 60.

To remove or access card 60, valve 50 is preferably turned to the drain position so that no fluid flows out of spray module 80. A brief amount of time should pass before turning valve 50 to the closed position. This time allows for any excess fluid to flow from cooling chamber 33 and into return chamber 31. Any fasteners in cover 40 should be removed prior to rotating it downward and into the open position. Card 60 can then be removed from chamber 33.

Figure 11:
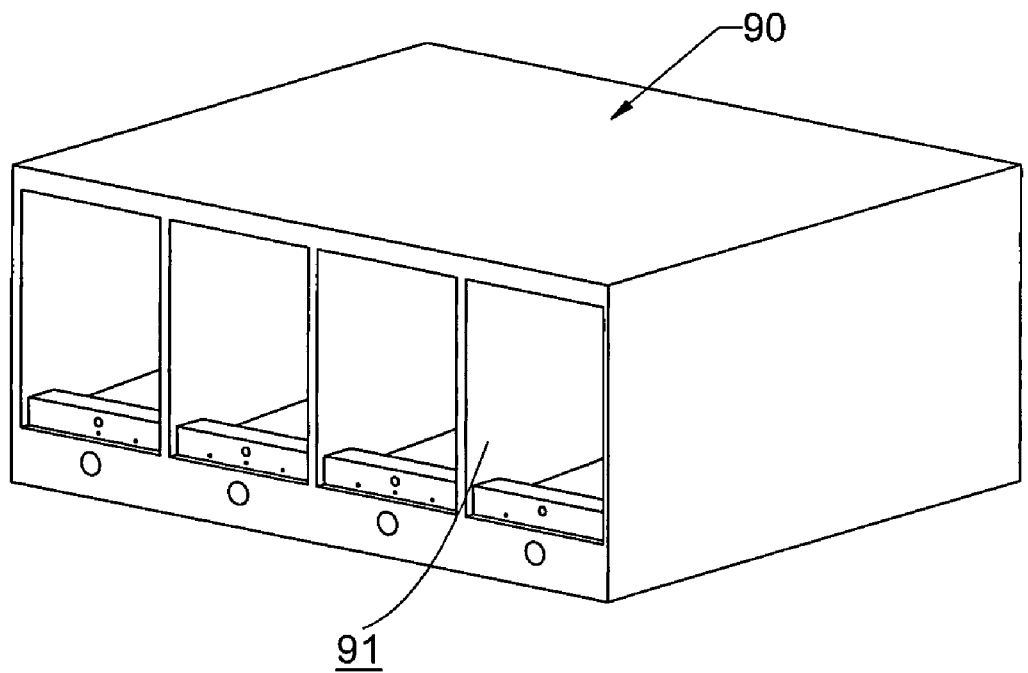
FIG. 11 is an alternative embodiment of the present invention, showing a chassis having cooling chambers that can support wide cards, or multiple cards within a single chamber.

Other embodiments of the present invention are possible. One such embodiment is shown in FIG. 11. A multi-card cooling system 90 is shown having a plurality of multi-card chamber 91. Fundamentally multi-card cooling system is the same as cooling system 20 of the preferred embodiment with the exception that the size of multi-card chamber 91 allows for multiple cards to be placed inside of a single cooling chamber. If two or more cards must be in operation together, than it may be advantageous to access both cards at the same time. The chassis may be less expensive to produce, cards may be swapped quicker, and there is less seal surface requirements, than the preferred embodiment. According to the present invention, any number of cooling chambers greater than two may be employed, and in any combination of single or multiple chambers in a single chassis.

Another embodiment of the present invention may utilize two separate valves rather than a single valve 50. Instead of valve 50 which is capable of shutting on and off both the supply and return fluids, having two separate valves allows control of each independently. Low cost plungers can provide the same net function as valve 50. Two separate valves may be advantageous for applications that space is not limited.

Another embodiment of the present invention is shown in FIG. 14. An electronic control system 21 can open and close electronic valves that control flow of fluid through chassis valve chamber 38. Electronic solenoid valves can be used instead of valve 50 which requires manual operation. Electronic control system 21 can be remotely operated via a software system. Acceptable commercially available solenoid valves can be obtained from Clippard Inc.

Figure 12:
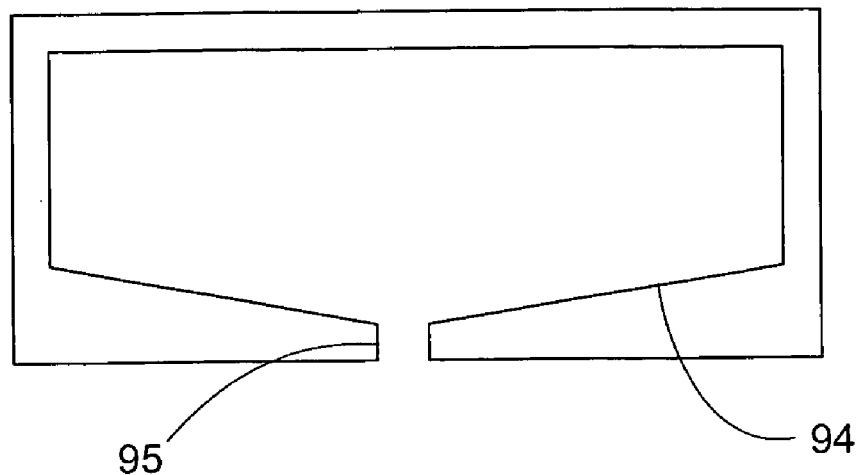
FIG. 12 is a side view of an alternative embodiment cooling chamber having two angled bottom surfaces.
Figure 13:
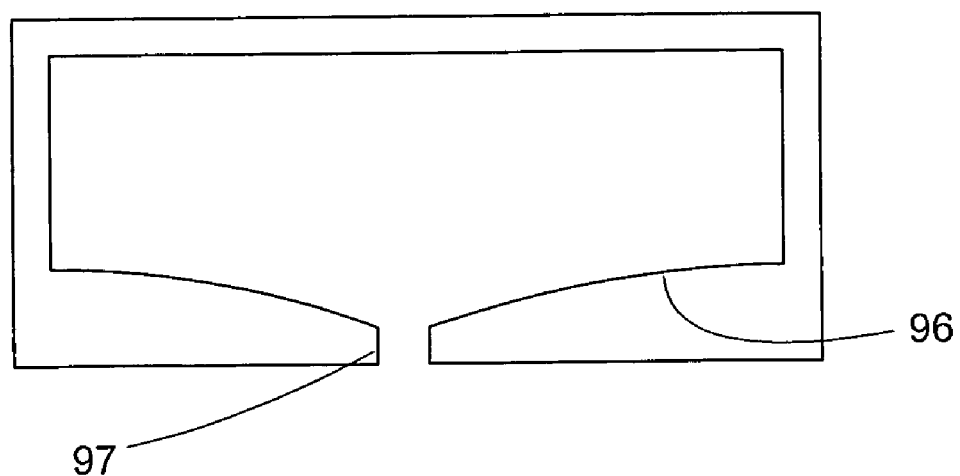
FIG. 13 is a side view of an alternative embodiment cooling chamber having two curved bottom surfaces; and, FIG. 14 is a flow chart showing the connections between some of the elements of the present invention.

Yet another embodiment is shown in FIG. 12. The walls of a cooling chamber are shown. Rather than having a single sloped bottom chamber surface such as described by the preferred embodiment, FIG. 12 shows an angled bottom 94. Both sides of an angled bottom return opening 95 flow towards it. This embodiment may be preferred for applications wherein system 20 may be placed in a mobile environment such as on a ship. Fluid would not easily collect inside cooling chamber 33 regardless of the direction system 20 is tilted. Another version of an alternative bottom surface is shown in FIG. 13. A curved bottom 96 causes fluid to flow to a curved bottom return opening 97. Curved bottom 96 need not be two dimensional as shown, but rather can have a three dimensional type curve. It may also have fluid channels protruding which could help guide fluid to curved bottom return opening 97.

In yet another embodiment, chassis 30 may be enclosed within a secondary enclosure. The secondary enclosure would have a secondary door for access to chassis 30 and the individual faceplates covers of the cooling system. The result may be a further sealed cooling system and a system that allows for fluid reclaim in the event a seal to an individual cooling chamber became compromised during operation.

While the multi-chamber global cooling system herein described constitute preferred embodiments of the invention, it is to be understood that the invention is not limited to these precise form of assemblies, and that changes may be made therein without departing from the scope and spirit of the invention as defined in the appended claims.

We claim:

1. A method of reducing the fluid loss of a closed loop cooling system, said method comprised of the steps:
   (A) introducing a supply of liquid coolant from a supply valve to a two-phase cooling chamber;
   (B) utilizing said supply of liquid coolant to cool an at least one electronic component;
   (C) removing a portion of said supply of liquid coolant via an outlet port of said two-phase cooling chamber, wherein said outlet port is fluidly connected to a return valve;
   (D) stopping the operation of said electronic component;
   (E) stopping the flow of said liquid coolant to said two-phase cooling chamber via said supply valve;
   (F) allowing a substantial portion of said liquid coolant within said two-phase cooling chamber to flow through said return valve and toward a reservoir; and,
   (G) after said substantial portion of said liquid coolant is removed from said two-phase cooling chamber, stopping the flow of said liquid coolant between said cooling chamber and said reservoir via said return valve.

2. The method of reducing fluid loss of a closed loop cooling system of claim 1, wherein an electronic control system controls the actuation of said supply valve.

3. The method of reducing fluid loss of a closed loop cooling system of claim 1, wherein an electronic control system controls the actuation of said return valve.

4. A method of reducing the interaction between a fluid of a closed loop cooling system and the environment, said method comprised of the steps:
   (A) introducing a supply of liquid coolant from a supply valve to a two-phase cooling chamber;
   (B) utilizing said supply of liquid coolant to cool an at least one electronic component;
   (C) removing a portion of said supply of liquid coolant via an outlet port of said two-phase cooling chamber, wherein said outlet port is fluidly connected to a return valve;
   (D) stopping the operation of said electronic component;
   (E) stopping the flow of said liquid coolant to said two-phase cooling chamber via said supply valve;
   (F) allowing a substantial portion of said liquid coolant within said two-phase cooling chamber to flow through said return valve and toward a reservoir;
   (G) after said substantial portion of said liquid coolant is removed from said two-phase cooling chamber, stopping the flow of said liquid coolant between said cooling chamber and said reservoir via said return valve; and,
   (H) after said return valve closes, gaining access to said two-phase cooling chamber by opening a sealed faceplate.

5. The method of reducing fluid loss of a closed loop cooling system of claim 4, wherein an electronic control system controls the actuation of said supply valve.

6. The method of reducing fluid loss of a closed loop cooling system of claim 4, wherein an electronic control system controls the actuation of said return valve.

* * * * *